(12) United States Patent
Goto et al.

(10) Patent No.: US 8,574,724 B2
(45) Date of Patent: Nov. 5, 2013

(54) ORGANIC ELECTROLUMINESCENT DEVICE, METHOD FOR MANUFACTURING THE ORGANIC ELECTROLUMINESCENT DEVICE, AND ELECTRONIC APPARATUS

(75) Inventors: Masashi Goto, Chino (JP); Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 981 days.

(21) Appl. No.: 11/781,613

(22) Filed: Jul. 23, 2007

(65) Prior Publication Data

US 2008/0038572 A1  Feb. 14, 2008

(30) Foreign Application Priority Data

Aug. 11, 2006 (JP) .................................. 2006-219635

(51) Int. Cl.
*H01L 51/54* (2006.01)
(52) U.S. Cl.
USPC ............... 428/690; 428/917; 427/58; 427/66; 313/502; 313/504; 257/40
(58) Field of Classification Search
None
See application file for complete search history.

(56) References Cited

U.S. PATENT DOCUMENTS

| 6,107,452 | A * | 8/2000 | Miller et al. ................... 528/422 |
| 6,413,658 | B1 * | 7/2002 | Araki ............................ 428/690 |
| 2003/0087464 | A1 | 5/2003 | Naka et al. |
| 2003/0157365 | A1 | 8/2003 | Kinoshita et al. |
| 2005/0158523 | A1 * | 7/2005 | Gupta et al. ............... 428/195.1 |
| 2005/0186106 | A1 * | 8/2005 | Li et al. ......................... 420/500 |
| 2006/0043885 | A1 * | 3/2006 | Poplavskyy et al. .......... 313/506 |

FOREIGN PATENT DOCUMENTS

| JP | A-7-85973 | 3/1995 |
| JP | A-2005-239789 | 9/2005 |
| JP | A 2005-243300 | 9/2005 |
| JP | A 2005-285617 | 10/2005 |
| TW | B-561792 | 11/2003 |

* cited by examiner

*Primary Examiner* — Gerard Higgins
*Assistant Examiner* — Andrew K Bohaty
(74) *Attorney, Agent, or Firm* — Oliff & Berridge, PLC

(57) ABSTRACT

An organic electroluminescent device includes a pair of electrodes, and a first organic layer and a second organic layer in contact with each other formed between the electrodes by a wet process. The first organic layer contains a crosslinkable organic material and includes a crosslinked layer formed by crosslinking the crosslinkable organic material at least at the interface with the second organic layer.

11 Claims, 12 Drawing Sheets

ORGANIC ELECTROLUMINESCENT DEVICE, METHOD FOR MANUFACTURING THE ORGANIC ELECTROLUMINESCENT DEVICE, AND ELECTRONIC APPARATUS

BACKGROUND

Technical Field

The present invention relates an organic electroluminescent device, a method for manufacturing the organic electroluminescent device, and an electronic apparatus.

An organic electroluminescent device (organic EL device) has been expected to be a next generation display device. The organic EL device includes an organic EL element disposed on a base, and the organic EL element includes a luminescent layer disposed between an upper and a lower electrode. Typically, an organic EL device has a multilayer structure formed by stacking an anode, an organic function layer (hole injection layer, luminescent layer, etc.), and a cathode on an optically transparent substrate made of glass or the like. In the structure, the anode and the cathode supply a current to the organic function layer, so that the luminescent layer of the organic function layer emits light.

Organic EL devices are required to increase their luminous efficiency. Japanese Unexamined Patent Application Publication No. 2005-285617 has disclosed an organic EL device having an electron transport layer between the cathode and the luminescent layer. The electron transport layer controls electron mobility to accumulate electrons efficiently in the luminescent layer. By providing the electron transport layer, the probability of recombination between holes and electrons in the luminescent layer can be increased to enhance the luminous efficiency.

Organic EL devices are broadly divided into two types using low-molecular-weight organic materials and macromolecular organic materials. In general, low-molecular-weight organic function layers of low-molecular-weight organic EL devices are formed by a dry process such as vapor deposition, and macromolecular organic function layers of macromolecular organic EL devices are formed by a wet process such as an ink jet method. In the organic EL device disclosed in the above-cited Japanese Unexamined Patent Application Publication No. 2005-785617, the electron transport layer is formed of a low-molecular-weight organic material by vapor deposition on a macromolecular luminescent layer formed by a wet process. There is however apprehension that the organic EL device having such a macromolecular organic material layer/low-molecular-weight organic material layer structure cannot necessarily ensure satisfying electron transport at the interface.

SUMMARY

An advantage of some aspects of the invention is that it provides an organic electroluminescent device having an enhanced electron transport efficiency at the interface between the luminescent layer and the electron transport layer, and a method for manufacturing the organic electroluminescent device. The invention further provides an electronic apparatus, such as an organic EL display or an optical printer; including the organic electroluminescent device and consequently exhibiting high brightness and long lifetime.

According to an aspect of the invention, an organic electroluminescent device is provided which includes a pair of electrodes, and a first organic layer and a second organic layer in contact with each other formed between the electrodes by a wet process. The first organic layer contains a crosslinkable organic material, and includes a crosslinked layer formed by crosslinking the crosslinkable organic material at least at the interface with the second organic layer.

In this organic electroluminescent device, the entire organic function layer including the first organic layer and the second organic layer has been formed by a wet process. Consequently, the transport efficiency of electrons or holes can be enhanced at each interface of the layers. Thus, the organic electroluminescent device can exhibit high luminous efficiency. In addition, since the first organic layer is made of a crosslinkable organic material so as to be insoluble in solvents that can dissolve the second organic layer, the first organic layer is not dissolved even though the second organic layer is formed by a wet process. Thus the organic electroluminescent device can be highly reliable.

Preferably, the first organic layer is a luminescent layer and the second organic layer is an electron transport layer. In this instance, the crosslinkable organic material is a crosslinkable luminescent material.

Since the luminescent layer is made of a crosslinkable luminescent material and is insoluble in solvents that can dissolve the electron transport layer, the luminescent layer is not dissolved even though the electron transport layer is formed by a wet process. Thus, the organic electroluminescent device can be highly reliable.

Preferably, the first organic layer is a luminescent layer containing the crosslinkable organic material and a luminescent material, and the second organic layer is an electron transport layer. The crosslinkable organic material has been crosslinked to form the crosslinked layer containing the luminescent material.

Since the luminescent layer is made of the crosslinkable organic material and the luminescent material and is insoluble in solvents that can dissolve the electron transport layer, the luminescent layer is not dissolved even though the electron transport layer is formed by a wet process. Thus, the organic electroluminescent device can be highly reliable.

In this instance, the crosslinkable organic material is preferably a crosslinkable luminescent material.

Consequently, the crosslinkable organic material contributes to light emission, and thus the luminous efficiency is not reduced even though the luminescent layer contains an organic material.

According to another aspect of the invention, an organic electroluminescent device is provided which includes a pair of electrodes, and a first organic layer and a second organic layer formed between the electrodes by a wet process. The first organic layer is made of an organic material soluble in a solvent having a different polarity from solvents that can dissolve the second organic layer.

In this organic electroluminescent device, the entire organic function layer including the first organic layer and the second organic layer has been formed by a wet process. Consequently, the transport efficiency of electrons or holes can be enhanced at each interface of the layers. Thus, the organic electroluminescent device can exhibit high luminous efficiency. In addition, since the solvents of the materials of the first organic layer and the second organic layer have different polarities from each other the first organic layer is not dissolved even though the second organic layer is formed by a wet process. Thus the organic electroluminescent device can be highly reliable.

According to another aspect of the invention, an organic electroluminescent device is provided which includes a pair of electrodes, and a first organic layer and a second organic layer formed between the electrodes by a wet process. The first organic layer is made of an organic material having a lower solubility in solvents that can dissolve the second organic layer than the material of the second organic layer.

In this organic electroluminescent device, the entire organic function layer including the first organic layer and the second organic layer has been formed by a wet process. Consequently, the transport efficiency of electrons or holes can be enhanced at each interface of the layers. Thus, the organic EL device can exhibit high luminous efficiency. In addition, since the material of the second organic layer is dissolved in a solvent that can more dissolve the second organic layer than the first organic layer, the first organic layer is not dissolved even though the second organic layer is formed by a wet process. Thus, the organic electroluminescent device can be highly reliable.

According to another aspect of the invention, an organic electroluminescent device is provided which includes a pair of electrodes, and a luminescent layer being a first organic layer and an electron transport layer being a second organic layer in contact with each other formed between the electrodes by a wet process. The electron transport layer contains a crosslinkable electron transport layer-forming material. The electron transport layer includes a crosslinked layer formed by crosslinking the electron transport layer-forming material and an uncrosslinked layer made of the electron transport layer-forming material In an uncrosslinked state.

In this organic electroluminescent device, the entire organic function layer including the first organic layer and the second organic layer is formed by a wet process. Consequently, the transport efficiency of electrons or holes can be enhanced at each interface of the layers. Thus, the organic electroluminescent device can exhibit high luminous efficiency. In addition, since the electron transport layer being the second organic layer is partially crosslinked to form a crosslinked layer, the crosslinked layer functions as a hole blocking layer. Thus the organic electroluminescent device can exhibit high luminous efficiency.

Preferably, the crosslinked layer of the electron transport layer lies at the interface with the luminescent layer, and the uncrosslinked layer of the electron transport layer lies at the interface with one of the electrodes.

Thus, the crosslinked layer at the interface of the electron transport layer with the luminescent layer efficiently blocks holes flowing from the luminescent layer to the electron transport layer, and the uncrosslinked layer at the interface of the electron transport layer with the electrode promotes the transport of electrons into the luminescent layer. Consequently, the luminous efficiency can, be enhanced more than the case where the entire electron transport layer-forming material is crosslinked or the case where the electron transport layer-forming material is not crosslinked at all.

Preferably, the first organic layer is a luminescent layer made of a luminescent material and the second organic layer is an electron transport layer made of an electron transport layer-forming material. The luminescent material has an electrochemical oxidation potential lower than that of the electron transport layer forming material.

Thus, electrons injected to the electron transport layer can be efficiently transported into the luminescent layer, and consequently the luminous efficiency can be enhanced.

According to another aspect of the invention, a method is provided for manufacturing an organic electroluminescent device including a first organic layer and a second organic layer in contact with each other formed between a pair of electrodes. The method includes forming the first organic layer by disposing a crosslinkable organic material on a base and crosslinking the organic material to form a crosslinked layer insoluble in solvents that can dissolve the second organic layer at least at the interface of the first organic layer with the second organic layer.

Since the entire organic function layer including the first organic layer and the second organic layer is formed by a wet process in the method, the transport efficiency of electrons or holes can be enhanced at each interface of the layers. Thus, the resulting organic luminescent device can exhibit high luminous efficiency. In addition, since the first organic layer is formed of a crosslinkable organic material so as to be insoluble in solvents that can dissolve the second organic layer, the first organic layer is not dissolved even though the second organic layer is formed by a wet process. Thus, the resulting organic EL device can be highly reliable.

Preferably, the first organic layer acts as a luminescent layer, the second organic layer acts as an electron transport layer, and the crosslinkable organic material is a crosslinkable luminescent material.

Since the luminescent layer is formed of a crosslinkable luminescent material so as to be insoluble in solvents that can dissolve the electron transport layer, the luminescent layer is not dissolved even though the electron transport layer is formed by a wet process. Thus, the resulting organic EL device can be highly reliable.

Preferably, the first organic layer acts as a luminescent layer, the second organic layer acts as an electron transport layer, and the luminescent layer is formed by disposing the crosslinkable organic material and a luminescent material on the base and crosslinking the organic material to form the crosslinked layer having a crosslinked structure containing the luminescent material and insoluble in solvents that can dissolve the electron transport layer.

Since the luminescent layer is formed of a crosslinkable organic material and a luminescent material so as to be insoluble in solvents that can dissolve the electron transport layer, the luminescent layer is not dissolved even thought the electron transport layer is formed by a wet process. Thus, the resulting organic electroluminescent device can be highly reliable.

In this instance, the crosslinkable organic material is preferably a crosslinkable luminescent material.

Consequently, the organic material contributes to light emission, and thus the luminous efficiency is not reduced even though the luminescent layer contains an organic material.

According to another aspect of the invention, a method is provided for manufacturing an organic electroluminescent device including a first organic layer and a second organic layer formed between a pair of electrodes. In the method, the material of the first organic layer is dissolved in a solvent having a different polarity from the solvent of the material of the second organic layer.

Since the entire organic function layer including the first organic layer and the second organic layer is formed by a wet process, the transfer efficiency of electrons or holes can be enhanced at each interface of the layers. Consequently, the resulting organic electroluminescent device can exhibit high luminous efficiency. In addition, since the solvent of the first organic layer-forming material has a different polarity from the solvent of the second organic layer-forming material, the first organic layer is not dissolved even though the second organic layer is formed by a wet process. Thus the resulting organic electroluminescent device can be highly reliable.

According to another aspect of the invention; a method is provided for manufacturing an organic electroluminescent device including a first organic layer and a second organic layer formed between a pair of electrodes. In the method, the material of the second organic layer is dissolved in a solvent that can more dissolve the second organic layer than the first organic layer.

Since the entire organic function layer including the first organic layer and the second organic layer is formed by a wet process, the transport efficiency of electrons or holes can be enhanced at each interface of the layers. Consequently, the resulting organic electroluminescent device can exhibit high luminous efficiency. In addition, since the solvent of the material of the second organic layer can more dissolve the second organic layer than the first organic layers the first organic layer is not dissolved even though the second organic layer is formed by a wet process. Thus the resulting organic electroluminescent device can be highly reliable.

According to another aspect of the invention, a method is provided for manufacturing an organic electroluminescent device including a first organic layer and a second organic layer in contact with each other formed between a pair of electrodes. The method includes forming the second organic layer by disposing a crosslinkable second organic layer-forming material on the first organic layer and crosslinking part of the crosslinkable second organic layer-forming material to form a crosslinked layer defined by a crosslinked portion of the second organic layer-forming material and an uncrosslinked layer defined by an uncrosslinked portion of the second organic layer-forming material. In this method, the first organic layer acts as a luminescent layer and the second organic layer acts as an electron transport layer, and the second organic layer-forming material is an electron transport layer-forming material.

Since the entire organic function layer including the first organic layer and the second organic layer is formed by a wet process, the transport efficiency of electrons or holes can be enhanced at each interface of the layers. Consequently, the resulting organic electroluminescent device can exhibit high luminous efficiency. In addition, the second organic layer or electron transport layer is partially crosslinked to form a crosslinked layer. Since the crosslinked layer can function as a hole blocking layer, the resulting organic electroluminescent device can exhibit high luminous efficiency.

In this instance, preferably, the electron transport layer-forming material is subjected to a crosslinking reaction from the luminescent layer side to form the crosslinked layer at the interface of the electron transport layer with the luminescent layer and the uncrosslinked layer at the interface with one of the pair of electrodes.

The crosslinked layer formed at the interface of the electron transport layer with the luminescent layer efficiently blocks holes flowing from the luminescent layer to the electron transport layer, and the uncrosslinked layer at the interface of the electron transport layer with the electrode promotes the transport of electrons into the luminescent layer. Consequently, the luminous efficiency can be enhanced more than the case where the entire electron transport layer-forming material is crosslinked or where the electron transport layer-forming material is not crosslinked at all.

According to another aspect of the invention, an electronic apparatus is provided which includes any one of the above-described organic electroluminescent devices.

Thus, the electronic apparatus can exhibit high luminous efficiency. The electronic apparatus may be an organic EL display apparatus (organic EL display) including the organic electroluminescent devices in the display portion, or an image-forming apparatus (optical printer) including the organic electroluminescent devices in a line head. The invention may be applied to an illuminating device (for example, backlight) including the organic electroluminescent device as a surface light source.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
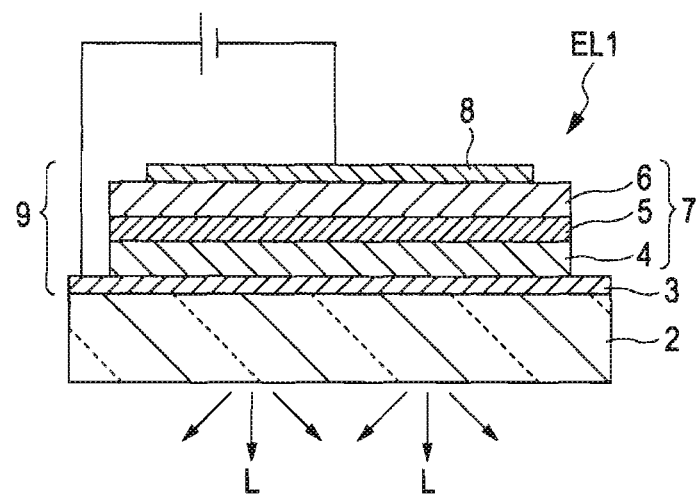
FIG. 1 is a schematic sectional view of an organic EL device according to a first embodiment of the invention.

The invention will be further described with reference to the drawings. The components and members shown in the drawings are illustrated on different scales for the sake of easy recognition.

First Embodiment

Structure of Organic EL Device

FIG. 1 is a schematic sectional view of an organic EL device according to a first embodiment of the invention. The organic EL device EL1 includes an anode 3 being a first electrode, a hole injection layer 4, a luminescent layer 5 being a first organic layer, an electron transport layer 6 being a second organic layer, and a cathode 8 being a second electrode on a base 2. The hole injection layer 4, the luminescent layer 5, and the electron transport layer 6 are organic layers made of organic materials and these organic layers define an organic function layer 7. The organic function layer 7 lies between the first electrode 3 and the second electrode 8. The first electrode 3, the organic function layer 7, and the second electrode 8 define an organic EL element 9.

The first electrode 3 and the second electrode 8 are connected to a wire to apply a driving voltage. When a driving voltage is applied to the electrodes through the wire, electrons are injected from the second electrode 8 to the luminescent layer 5 and holes are injected from the first electrode 8 to the luminescent layer 5. The electrons and holes move in the luminescent layer 5 to recombine each other by an applied electric field. By recombining the electrons and holes, energy is generated to produce excitons. The excitons release energy to emit fluorescence or phosphorescence when they return to the ground state. The light from the organic EL, element 9 is emitted through the base 2, which may be a glass substrate, to extract to the outside (bottom emission type) In the following description, the holes and electrons in the luminescent layer may be called carriers in some cases.

The hole injection layer 4 is made of, for example, an arylamine derivative, a phthalocyanine derivative, a mixture of a polyaniline derivative and an organic acid or a polythiophene derivative and a polymer acid. In particular, a mixture of polyethylenedioxythiophene (PEDOT) and polystyrene sulfonate (PSS) is suitably used.

The luminescent layer 5 contains a luminescent material having a crosslinkable functional group, such as epoxy, as a luminescent layer-forming material (first organic material layer-forming material). Examples of such a luminescent material include known luminescent polymer materials that can emit fluorescence or phosphorescence, such as polyfluorene derivatives (PF), poly(p-phenylenevinylen) derivatives (PPV), polyphenylene derivatives (PP), poly(p-phenylene) derivatives (PPP), polyvinylcarbazole (PVK), and polythiophene derivatives, and poly silane organic polymers such as poly(methylphenylsilane) (PMPS).

The luminescent material is crosslinked so that the resulting luminescent layer 5 becomes insoluble in solvents. Therefore, the luminescent layer 5 is not dissolved in the solvent of the material of the electron transport layer 6 even though the electron transport layer 6 is formed on the luminescent layer 5 by a wet process.

The electron transport layer 6 is made of an electron transport layer-forming material (second organic layer-forming material), and examples of the electron transport layer-forming material include organic polymers, such as polyfluorene derivatives, poly(p-phenylenevinylen) derivatives, poly(p-phenylene) derivatives, polyvinylcarbazole, polythiophene derivatives, and poly(methylphenylsilane) and other polysilanes.

Preferably, the electron transport layer-forming material has a lower electrochemical reduction potential than the luminescent material of the luminescent layer 5 from the viewpoint of efficiently transporting electrons injected from the second electrode 8 to the luminescent layer 5. In addition, the electron transport layer-forming material has a higher electrochemical oxidation potential than the luminescent material of the luminescent layer 5, from the viewpoint of preventing holes injected from the hole injection layer 4 to the luminescent layer 5 from passing through the luminescent layer to the second electrode without recombining with electrons. Thus, the luminous efficiency can be enhanced.

Figure 2:
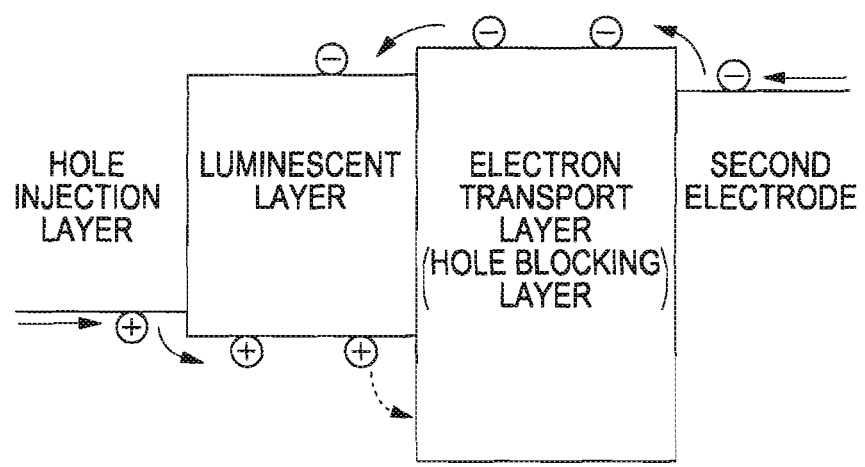
FIG. 2 is a band diagram of the organic EL device.

FIG. 2 is a band diagram of the organic EL element 9. In FIG. 2, the luminescent layer 5 has a larger LUMO (lowest unoccupied molecular orbital) than the electron transport layer 6, so that electrons are efficiently transported from the electron transport layer 6 to the luminescent layer 5. The HOMO (highest occupied molecular orbital) of the luminescent layer 5 is smaller than that of the electron transport layer 6, so that the holes injected to the luminescent layer 6 is blocked at the interface between the luminescent layer and the electron transport layer 6. Consequently, the electron transport layer 6 serves to transport electrons to the luminescent layer 5 and doubles as a hole blocking layer for blocking the holes coming from the luminescent layer 5.

Manufacturing Method of Organic EL Device

A method for manufacturing the organic EL device EL1 will now be described with reference to FIGS. 3A to 3C.

Figure 3A:
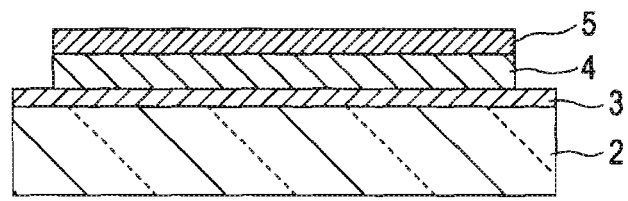
FIGS. 3A to 3C are process views of a method for manufacturing the organic EL device.

First, a hole injection layer 4 and a luminescent layer 5 are formed on a first electrode 3 on a base 2 by a wet process, as shown in FIG. 3A. The wet process may be performed by, for example, spine coating, liquid ejection, dip coating, or roll coating. In particular, liquid ejection is suitable because it can appropriately dispose a desired amount of material to a desired position without wasting the material.

Liquid ejection (typically an Ink jet method) may be performed by, for example, charge control, pressure and vibration, electromechanical conversion, electrothermal conversion, or electrostatic suction. In the charge control method, carries are applied to the material by an electrifying electrode and the material is ejected from a nozzle in a direction controlled with a deflecting electrode. In the pressure vibration method, an ultra high pressure is applied to the material to eject it from the end of the nozzle. When a control voltage is not applied, the material goes straight to be ejected from the nozzle; when a control voltage is applied, electrostatic repulsion occurs among molecules of the material to scatter the material, thereby hindering the ejection of the material from the nozzle. The electromechanical conversion method (piezoelectric method) is based on the characteristic feature of the piezoelectric element being deformed by receiving a pulsed electrical signal. The deformation of a piezoelectric element applies a pressure to the space containing the material through a flexible member, thereby ejecting the material from the nozzle by pressure. In the electrothermal conversion method, the material contained in the space is evaporated by rapidly heating the material with a heater disposed in the space containing the material to generate bubbles. The pressure of the bubbles ejects the material from the space containing the material. In the electrostatic suction method, a very low pressure is applied to the space containing the material to form a meniscus of the material at the nozzle. An electrostatic attraction is applied in this state to draw the material. Other methods may be applied, such as methods using changes in viscosity of fluid by applying an electric field, and scattering the material by discharge spark.

The hole injection layer 4 is formed by, for example, disposing a liquid material containing a hole injection layer-forming material such as 3,4-polyethylenedioxythiophene/polystyrene sulfonate (PEDOT/PSS) at a thickness of 20 to 100 nm on the first electrode 3, and drying and firing the liquid material at about 200° C. for about 10 minutes. The hole injection layer-forming material can be dissolved in polar solvents, such as isopropyl alcohol, N-methylpyrrolidone, and 1,3-dimethyl-imidazolinone.

The luminescent layer 5 is formed by, for example, disposing a liquid material containing a luminescent material expressed by general formula (1) at a thickness of 50 to 200 nm on the hole injection layer 4, and heat-treating the liquid material in an atmosphere of an inert gas, such as nitrogen, at about 130 to 200° C. for about 30 minutes. The luminescent material expressed by general formula (1) is prepared by treating the terminal groups of poly(9,9-dioctylfluorene) with phenyl epoxide. The epoxy group of the phenyl epoxide is crosslinkable. A nonpolar solvent that cannot dissolve the hole injection layer 4, such as toluene, is used as the solvent of the luminescent material, from the viewpoint of preventing the hole injection layer 4 from dissolving.

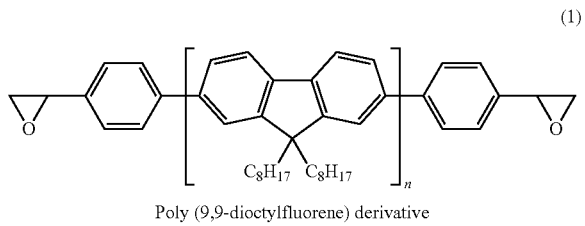

Poly (9,9-dioctylfluorene) derivative (1)

The luminescent material expressed by general formula (1) forms a layer (crosslinked layer) insoluble in solvents that can dissolve the electron transport layer 6 by heat treatment, by which the crosslinkable functional groups, or epoxy groups, of the luminescent material are crosslinked. Such a crosslinked layer may occupy the entirety of the luminescent layer 5, or may be formed only at the interface of the luminescent layer 5 with the electron transport layer 6. As long as the crosslinked layer is disposed at least at the interface of the luminescent layer 5 with the electron transport layer 6, the luminescent layer 5 is not dissolved in the solvent of the electron transport layer 6 when the electron transport layer 6 is formed by a wet process.

While the luminescent material expressed by general formula (1) has phenyl epoxides as the crosslinkable functional group, epoxy groups other than phenyl epoxide, groups having a double bond, or cyclic ether groups may be used as the crosslinkable group. While in the luminescent material expressed by general formula (1), the crosslinkable functional group has been introduced to the ends of the polymer, it may be introduced inside the main chain skeleton or the branched chain skeleton.

Figure 3B:
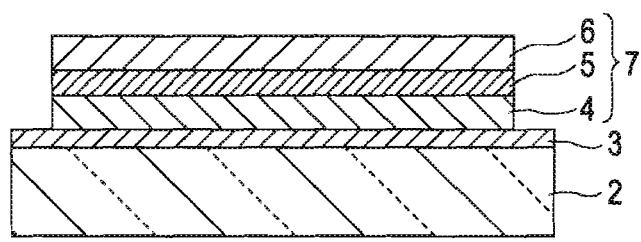

Turning now to FIG. 3B, an electron transport layer 6 is formed on the luminescent layer 5 by a wet process. For example, the electron transport layer 6 is formed by disposing a liquid material containing an electron transport layer-forming material expressed by general formula (2) at a thickness of about 5 to 50 nm on the luminescent layer 5, and subsequently heat-treating the liquid material at a temperature of about 130° C. for 30 minutes in an atmosphere of an inert gas, such as nitrogen. The electron transport layer-forming material can be dissolved in nonpolar solvents, such as toluene. Since the luminescent layer 5 has been turned insoluble in nonpolar solvents by the above-described treatment, the luminescent layer 5 is not dissolved in the solvent of the electron transport layer-forming material even though the liquid material is applied onto the luminescent layer 5.

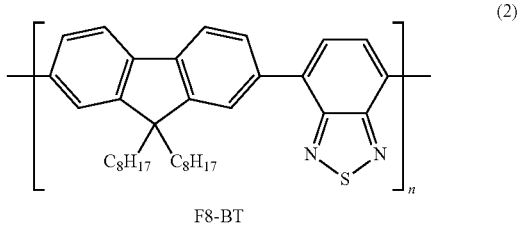

F8-BT (2)

Figure 3C:
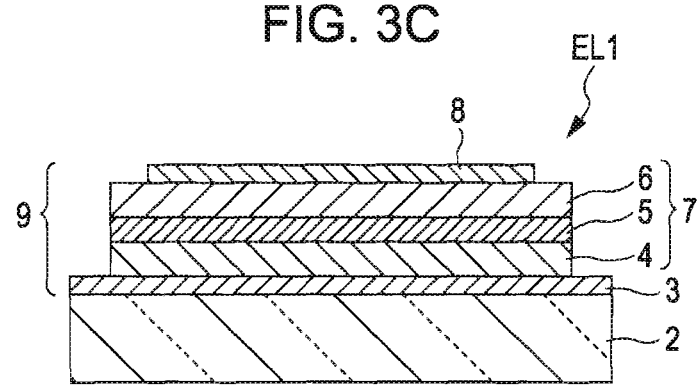

Turning now to FIG. 3C, a second electrode 8 is formed on the electron transport layer 6. For example, the second electrode 8 can be formed by depositing lithium fluoride, calcium, and aluminum in that order on the electron transport layer by vacuum vapor deposition. Thus, an organic EL element 9 is formed on the base 2. Then, a sealing step is performed if necessary, and thus an organic EL device EL1 is completed.

In the organic EL device EL1 of the present embodiment, the entire organic function layer 7 including the luminescent layer 5 and the electron transport layer 6 is formed by a wet process, as described above. Consequently, the transport efficiency of electrons or holes can be enhanced at each interface, and thus the resulting organic EL device can exhibit high luminous efficiency. In addition, since the luminescent layer 5 is made of a crosslinkable luminescent material and is insoluble in solvents that can dissolve the electron transport layer 6, the luminescent layer 5 is not dissolved even though the electron transport layer 6 is formed by a wet process. Thus the resulting organic EL device EL1 can be highly reliable.

Second Embodiment

Structure of Organic EL Device

Figure 4:
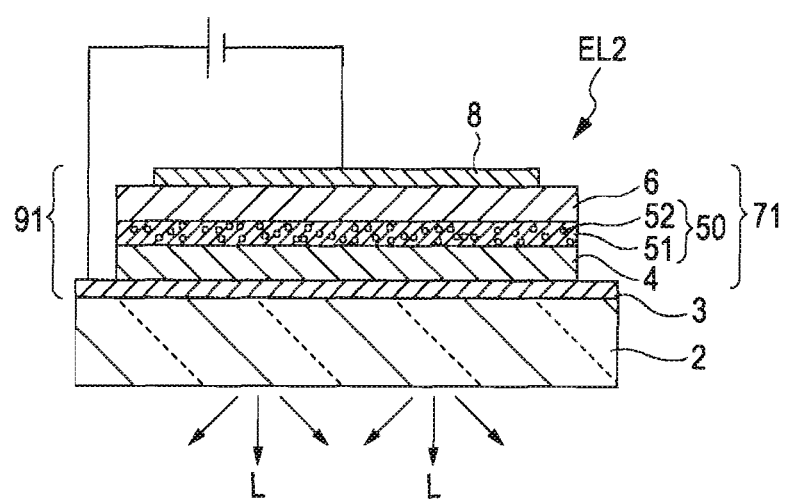
FIG. 4 is a schematic sectional view of an organic EL device according to a second embodiment of the invention.

FIG. 4 is a schematic sectional view of an organic EL device according to a second embodiment of the invention. The organic EL device EL2 includes an anode 3 being a first electrode, a hole injection layer 4, a luminescent layer 50 being a first organic layer, an electron transport layer 6 being a second organic layer, and a cathode 8 being a second electrode on a base 2. The hole injection layer 4, the luminescent layer 50, and the electron transport layer 6 are organic layers made of organic materials and these organic layers define an organic function layer 71. The organic function layer 71 lies between the first electrode 3 and the second electrode 8. The first electrode 3, the organic function layer 71, and the second electrode 8 define an organic EL element 91. All the structure of the organic EL device EL2 except the luminescent layer 50 is the same as that of the organic EL device EL1 shown in FIG. 1 of the first embodiment, and the second embodiment will mainly describe the structure and the forming method of the luminescent layer 50, omitting descriptions of other components.

The luminescent layer 50 contains an organic material 51 having a crosslinkable functional group, such as epoxy, and a luminescent material 52 as the luminescent layer-forming material (first organic layer-forming material). Organic luminescent polymers capable of emitting fluorescence or phosphorescence can be preferably used as the luminescent material 52, and examples of which include polyfluorene derivatives (PF), poly(p-phenylenevinylen) derivatives (PPV), polyphenylene derivatives (PP), poly(p-phenylene) derivatives (PPP), polyvinylcarbazole (PVK), polythiophene derivatives, and poly(methylphenylsilane) (PMPS) and other plysilanes. The organic material 51 may be a crosslinkable luminescent material prepared by introducing a crosslinkable functional group, such as an epoxy group, to those knows luminescent materials.

The luminescent layer 50 is a crosslinked layer having a crosslinked structure formed by crosslinking the organic material 51. The crosslinked structure is insoluble in solvents and contains the luminescent material 52. Thus, the luminescent layer 50 is not dissolved in the solvent of the electron transport layer 6 even though the electron transport layer 6 is formed on the luminescent layer 50 by a wet process.

Manufacturing Method of Organic EL Device

A method for manufacturing the organic EL device EL2 will now be described with reference to FIGS. 5A to 5C.

Figure 5A:
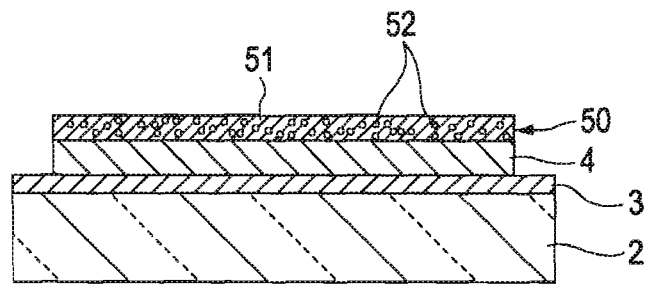
FIGS. 5A to 5C are process views of a method for manufacturing the organic EL device according to the second embodiment.

First, a luminescent layer 50 is formed by a wet process on the base 2 on which the first electrode 3 and the hole injection layer 4 have been formed, as shown in FIG. 5A. For example, the luminescent layer 50 is formed by disposing a liquid material containing an organic material 51 expressed by general formula (1) and a luminescent material 52 expressed by general formula (3) shown below at a thickness of about 50 to 200 nm on the hole injection layer 4, and subsequently heat-treating the liquid material in an atmosphere of an inert gas, such as nitrogen, at a temperature of about 130 to 200° C. for 30 minutes. The organic material 51 expressed by formula (1) is prepared by treating the terminal groups of poly(9,9-dioctylfluorene) with phenyl epoxide. The epoxy group of the phenyl epoxide is crosslinkable. From the viewpoint of preventing the hole injection layer 4 from dissolving, the organic material 51 and the luminescent material 52 are preferably dissolved in a nonpolar solvent that cannot dissolve the hole injection layer 4, such as toluene. The organic material 51 and the luminescent material 52 may be mixed in a ratio (organic material 51/luminescent material 52) of 5% to 500%.

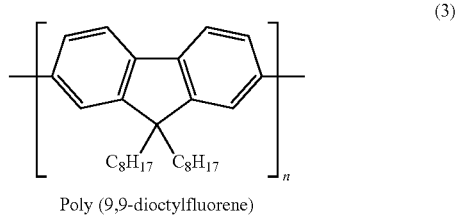

Poly (9,9-dioctylfluorene)

(3)

The organic material 51 expressed by formula (1) forms a layer (crosslinked layer) insoluble in solvents that can dissolve the electron transport layer 6 by heat treatment, by which the crosslinkable functional groups, or epoxy groups, of the luminescent material are crosslinked. Such a crosslinked layer may occupy the entirety of the luminescent layer 50, or may be formed only at the interface of the luminescent layer 50 with the electron transport layer 6. As long as the crosslinked layer is disposed at least at the interface of the luminescent layer 50 with the electron transport layer 6, the luminescent layer 50 is nor dissolved in the solvent of the electron transport layer 6 when the electron transport layer 6 is formed by a wet process.

While the organic material expressed by formula (1) has phenyl epoxides as the crosslinkable functional group, epoxy groups other than phenyl epoxide, groups having a double bond, or cyclic ether groups may be used as the crosslinkable group. While in the organic material expressed by formula (1), the crosslinkable functional group has been introduced to the ends of the polymer, it may be introduced inside the main chain skeleton or the branched chain skeleton.

Figure 5B:
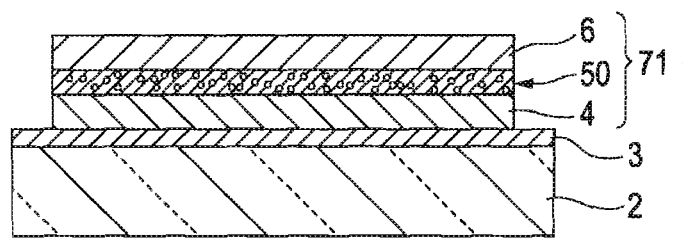

Turning now to FIG. 5B, an electron transport layer 6 is formed on the luminescent layer 50 by a wet process. For example, the electron transport layer 6 is formed in the same manner using the same material as in the first embodiment. Nonpolar solvents, such as toluene, may be used as the solvent of the electron transport layer-forming material. Since the luminescent layer 50 has been turned insoluble in nonpolar solvents by the above-described treatment, the luminescent layer 50 is not dissolved in the solvent of the electron transport layer-forming material even though the liquid material of the electron transport layer is applied onto the luminescent layer 50.

Figure 5C:
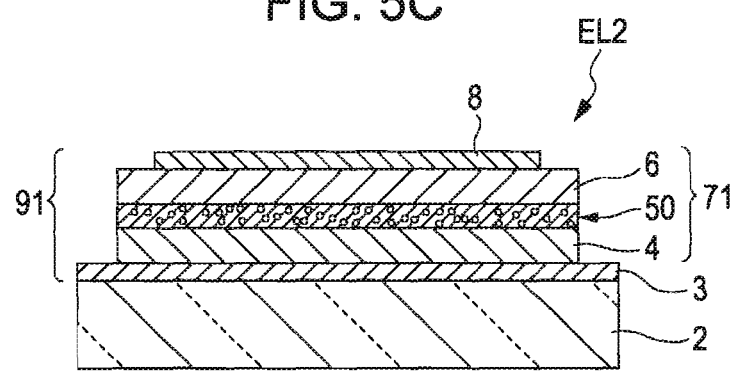

Turning now to FIG. 5C, a second electrode 8 is formed on the electron transport layer 6. Then, a sealing step is performed if necessary, and thus an organic EL device EL2 is completed.

In the organic EL device EL2 of the present embodiment as well, the entire organic function layer 71 including the luminescent layer 50 and the electron transport layer 6 is formed by a wet process. Consequently, the transport efficiency of electrons or holes can be enhanced at each interface. Consequently, the resulting organic EL device can exhibit high luminous efficiency. In addition, since the luminescent layer 50 is made of a crosslinkable organic material 51 and a luminescent material 52 and is insoluble in solvents that can dissolve the electron transport layer 6, the luminescent layer 50 is not dissolved even though the electron transport layer 6 is formed by a wet process. Thus the resulting organic EL device EL2 can be highly reliable. Furthermore, since the organic material 51 can emit light, the luminous efficiency does not decrease even though the organic material 51 is added, and accordingly bright images can be displayed.

Third Embodiment

Structure of Organic EL Device

Figure 6:
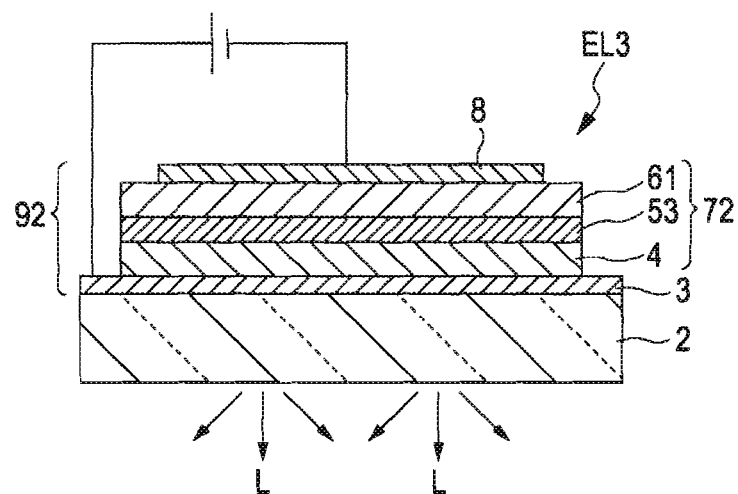
FIG. 6 is a schematic sectional view of an organic EL device according to a third embodiment of the invention.

FIG. 6 is a schematic sectional view of an organic EL device according to a third embodiment of the invention. The organic EL device EL3 includes an anode 3 being a first electrode, a hole injection layer 4, a luminescent layer 53 being a first organic layer, an electron transport layer 61 being a second organic layer, and a cathode 8 being a second electrode on a base 2. The hole injection layer 4, the luminescent layer 53, and the electron transport layer 61 are organic layers made of organic materials and these organic layers define an organic function layer 72. The organic function layer 72 lies between the first electrode 3 and the second electrode 8. The first electrode 3, the organic function layer 72, and the second electrode 8 define an organic EL element 92. All the structure of the organic EL device EL3 except the luminescent layer 53 and the electron transport layer 61 is the same as that of the organic EL device EL1 of the first embodiment shown in FIG. 1, and the third embodiment will mainly describe the structure and the forming method of the luminescent layer 53 and electron transport layer 61, omitting description of other components.

Preferred luminescent layer-forming materials (first organic layer-forming materials) for the luminescent layer 53 include known luminescent polymer materials that can emit fluorescence or phosphorescence, such as polyfluorene derivatives (PF), poly(p-phenylenevinylen) derivatives (PPV), polyphenylene derivatives (PP), poly(p-phenylene) derivatives (PPP), polyvinylcarbazole (PVK), polythiophene derivatives, and poly(methylphenylsilane) (PMPS) and other poly silanes.

Preferred electron transport layer-forming materials (second organic layer-forming materials) for the electron transport layer 61 include polyfluorene derivatives, poly(p-phenylenevinylen) derivatives, poly(p-phenylene) derivatives, polyvinylcarbazole, polythiophene derivatives, and poly(m-ethylphenylsilane) and other polysilanes. The electron transport layer-forming material is dissolved in a solvent having a polarity different from solvents that can dissolve the luminescent layer 53. Hence, the luminescent layer 53 is not dissolved in the solvent of the electron transport layer 61 even though the luminescent layer 53 is not crosslinked.

Manufacturing Method of Organic EL Device

A method for manufacturing the organic EL device EL3 will now be described with reference to FIGS. 7A to 7C.

Figure 7A:
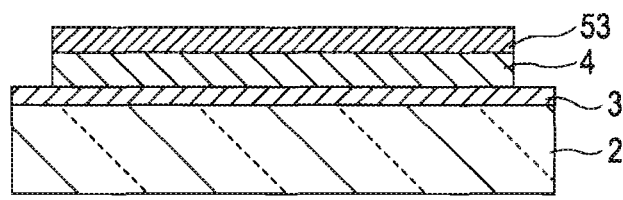
FIGS. 7A to 7C are process views of a method for manufacturing the organic EL device according to the third embodiment.

First, a luminescent layer 53 is formed by a wet process on the base 2 on which the first electrode 3 and the hole injection layer 4 have been formed, as shown in FIG. 7A. For example, the luminescent layer 53 is formed by disposing a liquid material containing a luminescent material expressed by general formula (3) at a thickness of about 50 to 200 nm on the hole injection layer 4, and subsequently heat-treating the liquid material in an atmosphere of an inert gas, such as nitrogen, at a temperature of about 130 to 200° C. for 30 minutes. From the viewpoint of preventing the hole injection layer 4 from dissolving, the solvent of the luminescent material is a nonpolar solvent that cannot dissolve the hole injection layer 4, such as toluene.

Figure 7B:
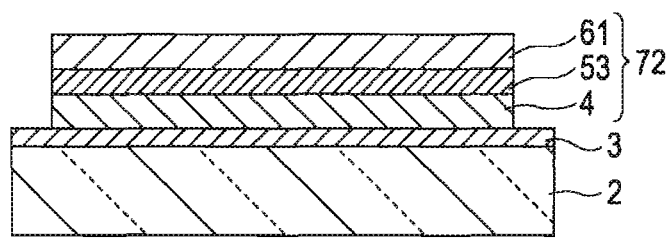

Turning now to FIG. 7B, an electron transport layer 61 is formed on the luminescent layer 53 by a wet process. For example, the electron transport layer 61 is formed by disposing a liquid material containing an electron transport layer-forming material expressed by general formula (4) at a thickness of about 5 to 50 nm on the luminescent layer 53, and subsequently heat-treating the liquid material at a temperature of about 130° C. for 30 minutes in an atmosphere of an inert gas, such as nitrogen. A polar solvent, such as methanol, can be used as the solvent of the electron transport layer-forming material. Since the polarity of this solvent is different from that of the solvent of the luminescent layer 53, the luminescent layer 53 is not dissolved even though the liquid material for the electron transport layer 61 is applied onto the luminescent layer 53.

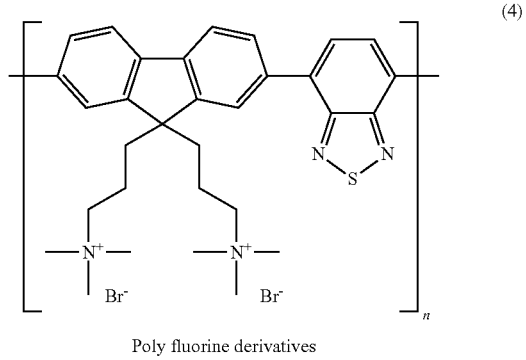

(4)

Poly fluorine derivatives

Figure 7C:
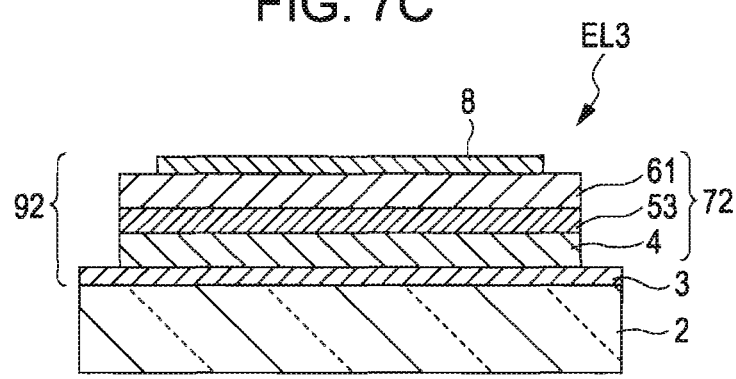

Turning now to FIG. 7C, a second electrode 8 is formed on the electron transport layer 61. Then, a sealing step is performed if necessary, and thus an organic EL device EL3 is completed.

In the organic EL device EL3 of the present embodiment as well, the entire organic function layer 72 including the luminescent layer 53 and the electron transport layer 61 is formed by a wet process. Consequently the transport efficiency of electrons or holes can be enhanced at each interface, and thus the resulting organic EL device can exhibit high luminous efficiency. In addition, since the solvent of the luminescent layer-forming material has a different polarity from the solvent of the electron transport layer-forming material, the luminescent layer 53 is not dissolved even though the electron transport layer 61 is formed by a wet process. Thus, the resulting organic EL device EL3 can be highly reliable.

Fourth Embodiment

Structure of Organic EL Device

Figure 8:
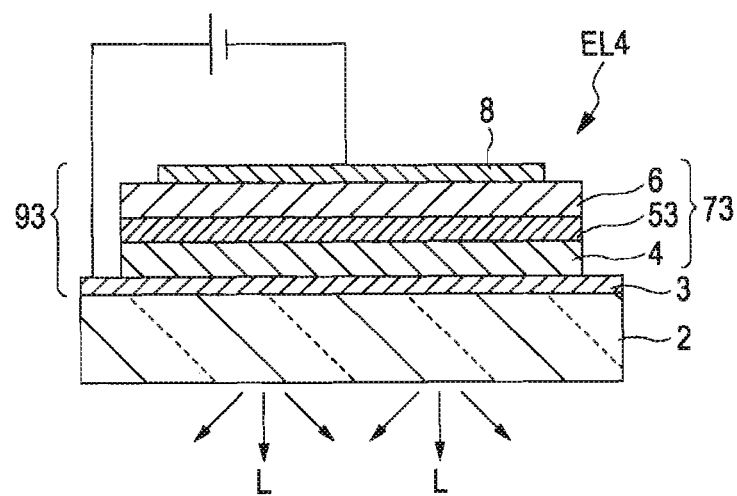
FIG. 8 is a schematic sectional view of an organic EL device according to a fourth embodiment of the invention.

FIG. 8 is a schematic sectional view of an organic EL device according to a fourth embodiment of the invention. The organic EL device EL4 includes an anode 3 being a first electrode, a hole injection layer 4, a luminescent layer 53 being a first organic layer, an electron transport layer 6 being a second organic layer, and a cathode 8 being a second electrode on a base 2. The hole injection layer 4, the luminescent layer 53, and the electron transport layer 6 are organic layers formed of organic materials and these organic layers define an organic function layer 73. The organic function layer 73 lies between the first electrode 3 and the second electrode 8. The first electrode 3, the organic function layer 73, and the second electrode 8 define an organic EL element 93. The structures of the luminescent layer 53 and the electron transport layer 6 are the same as those in the third embodiment and the first embodiment, respectively.

Manufacturing Method of Organic EL Device

A method for manufacturing the organic EL device EL4 will now be described with reference to FIGS. 9A to 9B.

Figure 9A:
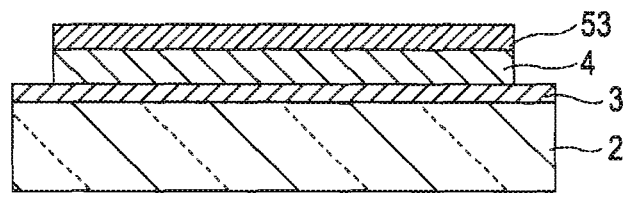
FIGS. 9A to 9C are process views of a method for manufacturing the organic EL device according to the fourth embodiment.

First, a luminescent layer 53 is formed by a wet process on the base 2 on which the first electrode 3 and the hole injection layer 4 have been formed, as shown in FIG. 9A. For example, the luminescent layer 53 is formed of the same material by the same method as those of the third embodiment. From the viewpoint of preventing the hole injection layer 4 from dissolving, the luminescent material is dissolved in a nonpolar solvent that cannot dissolve the hole injection layer 4, such as toluene.

Figure 9B:
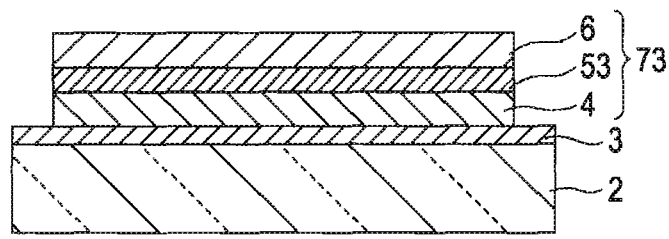

Turning now to FIG. 9B, an electron transport layer 6 is formed on the luminescent layer 53 by a wet process. For example, the electron transport layer 6 is formed by disposing a liquid material containing an electron transport layer-forming material expressed by general formula (2) at a thickness of about 5 to 50 nm on the luminescent layer 53, and subsequently heat-treating the liquid material at a temperature of about 130° C. for 30 minutes in an atmosphere of an inert gas, such as nitrogen. The solvent of the electron transport layer-forming material can be a nonpolar solvent that can less dissolve the luminescent layer 53, such as, xylene. Xylene and similar nonpolar solvents can easily dissolve the electron transport layer-forming material expressed by general formula (2), but cannot easily dissolve the luminescent material expressed by general formula (3). Consequently, the luminescent layer 53 is not dissolved even though the liquid material containing the solvent of the electron transport layer-forming material is applied onto the luminescent layer 53.

Figure 9C:
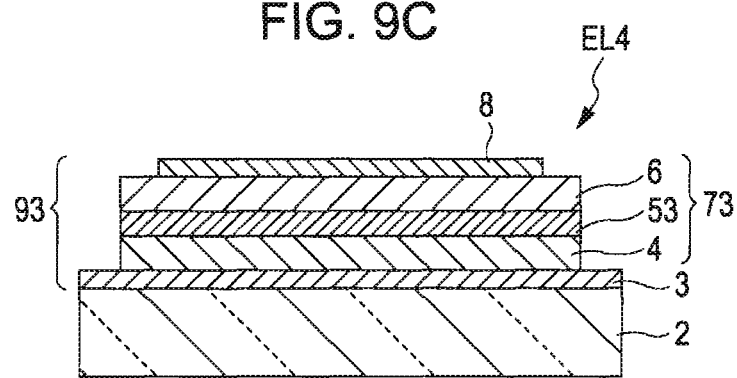

Turning now to FIG. 9C, a second electrode 8 is formed on the electron transport layer 6. Then, a sealing step is performed if necessary, and thus an organic EL device EL4 is completed.

In the organic EL device EL4 of the present embodiment as well, the entire organic function layer 73 including the luminescent layer 53 and the electron transport layer 6 is formed by a wet process. Consequently, the transport efficiency of electrons or holes can be enhanced at each interface, and thus the resulting organic EL device can exhibit high luminous efficiency. In addition, since the solvent of the electron transport layer-forming material cannot dissolve the luminescent layer 53, but can dissolve the electron transport layer 6, the luminescent layer 53 is not dissolved even though the electron transport layer 6 is formed by a wet process. Thus, the resulting organic EL device EL4 can be highly reliable.

Fifth Embodiment

Structure of Organic EL Device

Figure 10:
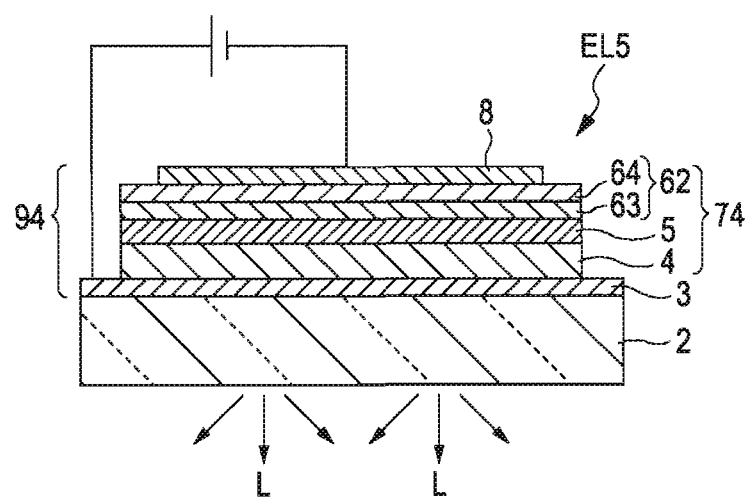
FIG. 10 is a schematic sectional view of an organic EL device according to a fifth embodiment of the invention.

FIG. 10 is a schematic sectional view of an organic EL device according to a fifth embodiment of the invention. The organic EL device EL5 includes an anode 3 being a first electrode, a hole injection layer 4, a luminescent layer 5 being a first organic layer, an electron transport layer 62 being a second organic layer, and a cathode 8 being a second electrode on a base 2. The hole Injection layer 4, the luminescent layer 5, and the electron transport layer 62 are organic layers made of organic materials and these organic layers define an organic function layer 74. The organic function layer 74 lies between the first electrode 3 and the second electrode 8. The first electrode 3, the organic function layer 74, and the second electrode 8 define an organic EL element 94. All the structure of the organic EL device EL5 except the electron transport layer 62 is the same as that of the organic EL device EL1 shown in FIG. 1 of the first embodiment, and the fifth embodiment will mainly describe the structure and the forming method of the electron transport layer 62, omitting descriptions of other components.

The electron transport layer-forming material (second organic layer-forming material) for the electron transport layer 62 may have a crosslinkable functional group, such as an epoxy group. Preferred examples of such an electron transport layer-forming material include polyfluorene derivatives, poly(p-phenylenevinylen) derivatives, poly(p-phenylene) derivatives, polyvinylcarbazole, polythiophene derivatives, polysilanes such as poly(methylphenylsilane), and other organic polymer materials.

By crosslinking part of the electron transport layer-forming material, a crosslinked layer 63, which is a crosslinked portion of the electron transport layer-forming material, and an uncrosslinked layer 64, which is an uncrosslinked portion of the electron transport layer-forming material, are formed in the electron transport layer 62. The crosslinked layer 63 lies at the interface of the electron transport layer 62 with the luminescent layer 5, and the uncrosslinked layer 64 lies at the interface of the electron transport layer 62 with the second electrode 8. The percentage of the crosslinked layer 63 in the electron transport layer 62 (percentage of cross-linkage of the electron transport layer-forming material) is about 50%.

Manufacturing Method of Organic EL Device

A method for manufacturing the organic EL device EL5 will now be described with reference to FIGS. 11A to 11C.

Figure 11A:
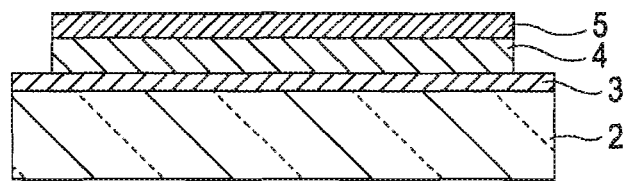
FIGS. 11A to 11C are process views of a method for manufacturing the organic EL device according to the fifth embodiment.

First, a luminescent layer 5 is formed by a wet process on the base 2 on which the first electrode 3 and the hole injection layer 4 have been formed, as shown in FIG. 11A. The material and the forming method of the luminescent layer 5 are the same as those in the first embodiment. The luminescent layer 5 has been turned into a crosslinked layer insoluble in solvents that can dissolve the electron transport layer 62 by crosslinking a luminescent material expressed by general formula (1). Such a crosslinked layer may occupy the entirety of the luminescent layer, or may be formed only at the interface of the luminescent layer 5 with the electron transport layer 62. As long as the crosslinked layer is disposed at least at the interface of the luminescent layer 5 with the electron transport layer 62, the luminescent layer 5 is not dissolved in the solvent of the electron transport layer 62 when the electron transport layer 62 is formed by a wet process.

Figure 11B:
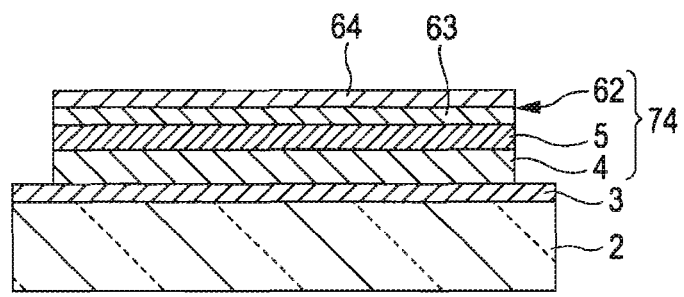

Turning now to FIG. 11B, an electron transport layer 62 is formed by a wet process on the luminescent layer 5. For example, the electron transport layer 62 is formed by disposing a liquid material containing an electron transport layer-forming material expressed by general formula (5), at a thickness of 5 to 50 nm on the luminescent layer 5, and subsequently heat-treating the liquid material at about 150° C. for 15 minutes in an atmosphere of an inert gas, such as nitrogen. The electron transport layer-forming material expressed by general formula (5) is prepared by treating the terminal groups of the compound expressed by general formula, poly[(9,9-dioctylfluorene-2,7-diyl)-co-(benzothiadiazole-4,7-diyl)], with phenyl epoxide. The epoxy group of the phenyl epoxide is crosslinkable. The electron transport layer-forming material may be dissolved in a nonpolar solvent, such as toluene. Since the luminescent layer 5 is turned insoluble in nonpolar solvents by the above-described treatment, the luminescent layer 5 is not dissolved in the solvent of the liquid material of the electron transport layer even though the liquid material is applied onto the luminescent layer 5.

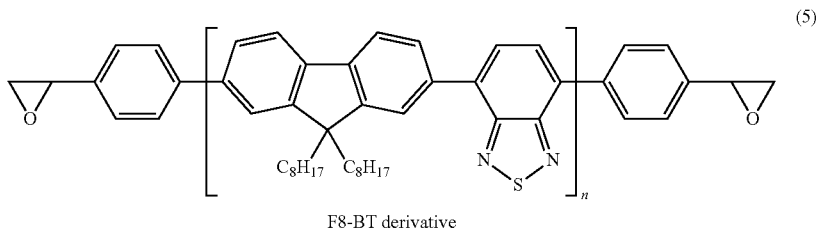

F8-BT derivative (5)

In the step of crosslinking the electron transport layer-forming material, the electron transport layer-forming material is subjected to heat treatment from the base 2 side so as to be crosslinked from the luminescent layer 5 side. Thus, the crosslinked layer 63, which is a crosslinked portion of the electron transport layer-forming material, is formed at the interface of the electron transport layer 62 with the luminescent layer 5, and the uncrosslinked layer 64, which is an uncrosslinked portion of the electron transport layer, is formed at the interface of the electron transport layer 62 with the second electrode 8.

The electron transport layer-forming material expressed by general formula (5) has crosslinkable functional groups, or epoxy groups; and the epoxy groups are crosslinked by heat treatment. The crosslinked layer 63 formed at the interface of the electron transport layer 62 with the luminescent layer 5 blocks holes injected from the hole injection layer 4 to contribute to the recombination between the holes and electrons in the luminescent layer 6. On the other hand, the uncrosslinked layer 64 formed at the interface of the electron transport layer 62 with the second electrode 8 does not have a crosslinked structure, and does not therefore interfere with the transport of electrons into the luminescent layer 6. Hence, if the entire electron transport layer-forming material is crosslinked, the luminous efficiency can be enhanced more than the case where the electron transport layer-forming material is not crosslinked at all.

While the electron transport layer-forming material expressed by general formula (5) has phenyl epoxides as the crosslinkable functional group, epoxy groups other than phenyl epoxide, groups having a double bond, or cyclic ether groups may be used as the crosslinkable group. While in the electron transport layer-forming material expressed by general formula (5), the crosslinkable functional group has been introduced to the ends of the polymer, it may be introduced inside the main chain skeleton or the branched chain skeleton.

Figure 11C:
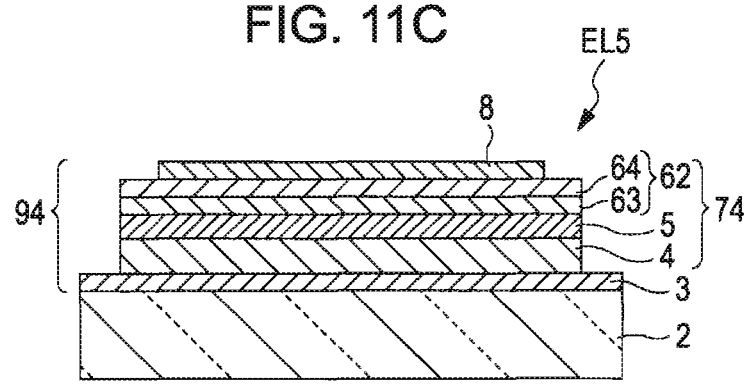

Turning now to FIG. 11C, a second electrode 8 is formed on the electron transport layer 62. Then, a sealing step is performed if necessary, and thus an organic EL device EL5 is completed.

In the organic EL device EL5 of the present embodiment as well, the entire organic function layer 74 including the luminescent layer 5 and the electron transport layer 62 is formed by a wet process. Consequently, the transport efficiency of electrons or holes can be enhanced at each interface, and thus the resulting organic EL device can exhibit high luminous efficiency. In addition, since the luminescent layer 5 is made of a crosslinkable luminescent material and is insoluble in solvents that can dissolve the electron transport layer 62, the luminescent layer 5 is not dissolved even though the electron transport layer 62 is formed by a wet process. Thus, the resulting organic EL device EL5 can be highly reliable. Furthermore, part of the electron transport layer 62 is crosslinked to form the crosslinked layer 63, so that the crosslinked layer 63 functions as a hole blocking layer and thus enhances the luminous efficiency of the organic EL device EL5. For example, when the percentage of cross-linkage is 50%, the luminous efficiency was 50% enhanced more than the case where the crosslinked layer is not provided.

While in the present embodiment, the luminescent layer 5 has the same structure as the luminescent layer 5 of the organic EL device EL1 of the first embodiment, it may has the same structure as the luminescent layer 53 of the organic EL device EL2 of the second embodiment structure can be applied as long as the underlayer of the electron transport layer is insoluble in the solvent of the electron transport layer.

Image-Forming Apparatus

Figure 12:
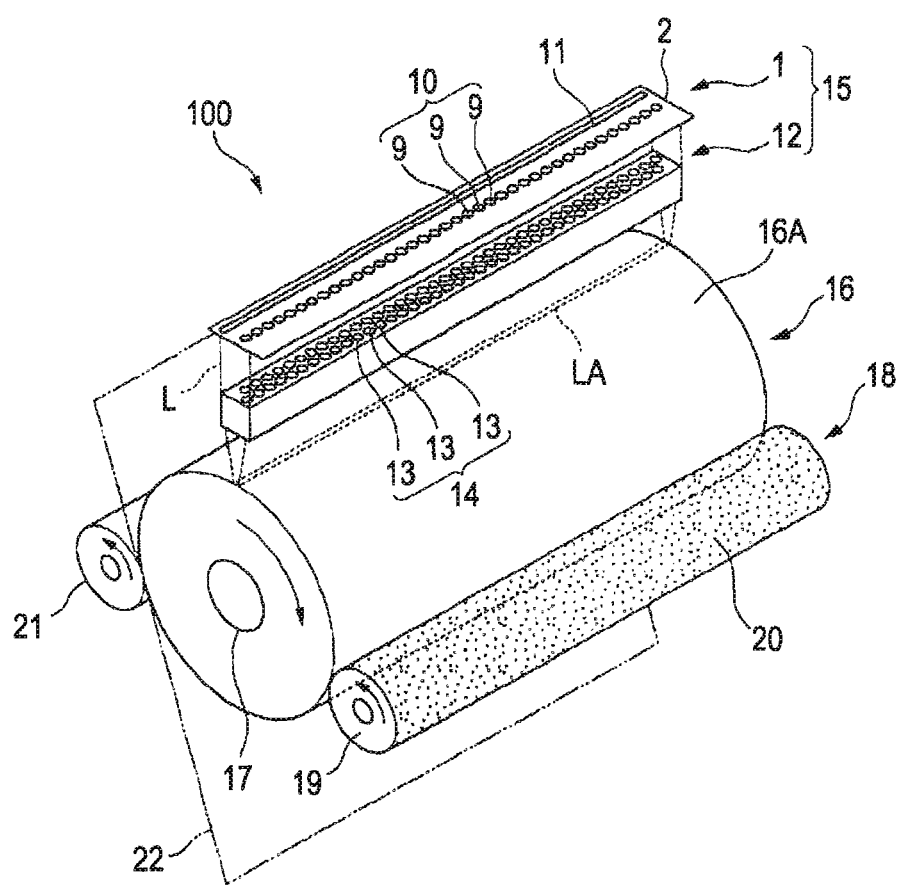
FIG. 12 is a schematic diagram of an image-forming apparatus being an electronic apparatus of the invention.

Embodiments of the electronic apparatus including an organic EL device of the invention will now be described. FIG. 12 shows an image-forming apparatus 100 being an embodiment of the electronic apparatus of the invention, and includes any one of the above-described organic EL devices as a line head.

The image-forming apparatus 100 includes a photosensitive drum 16 acting as an image support at the vicinity of the running path of transfer media 22, and an exposure device 15, development device 18, and a transfer roller 21 are disposed around the periphery of the photosensitive drum 16 along the rotation direction of the photosensitive drum 16 (indicated by an arrow). The photosensitive drum 16 is rotatably disposed on the rotating shaft 17, and has a photosurface 16A in the middle of the outer periphery in the direction of the rotating shaft. The exposure device 15 and the development device 18 are each disposed so as to extend along the rotating shaft 17 of the photosensitive drum 16, and their lengths in the longitudinal direction are substantially the same as the width of the photosurface 16A.

In the image-forming apparatus 100, while the photosensitive drum 16 is rotating the surface (photosurface 16A) of the photosensitive drum 16 is positively (+) charged by an electrifying device (not shown) disposed upstream to the exposure device 15 and is subsequently exposed with the exposure device 15. Thus, an electrostatic latent image LA is formed at the surface of the photosensitive drum 16. Then a development roller 19 of the development device 18 applies a toner (developer) 20 on the surface of the photosensitive drum 16 and a toner image is formed by the electrical adsorption power of the electrostatic latent image LA, according to the electrostatic latent image LA. In this instance, the toner particles are positively (+) charged.

After the development of the toner image by the development device 18, the photosensitive drum 16 is further rotated so that the toner image comes into contact with a transfer medium 22. The transfer medium 22 is electrified with the reversed polarity (in this case, negative (−) polarity) to the polarity of the toner particles of the toner image by the transfer roller 21, thereby drawing the toner particles forming the toner image to the transfer medium 22 from the surface of the photosensitive drum 16. Thus, the toner image is transferred onto the surface of the transfer medium 22.

The exposure device 15 includes a line head 1 having a plurality of organic EL elements 9 and an image-forming optical element 12 having a plurality of lens elements 13 that focus the light L emitted from the line head 1 to form erect 1:1 images. The line head 1 and the image-forming optical element 12 are held in a head case not shown) in an aligned manner with each other and fixed on the photosensitive drum 16.

The line head 1 includes a light-emitting element line 10 defined by the plurality of organic EL elements 9 aligned along the rotating shaft 17 of the photosensitive drum 16, driving elements (not shown) driving the organic EL elements 9, and control circuits 11 controlling the driving elements. The organic EL elements 9, the driving elements, and the control circuits 11 are disposed together on a long, narrow rectangular element substrate (base) 2.

The organic EL elements 9 each have any one of the structures shown in FIGS. 1, 4, 6, 8, and 10. Therefore they can emit light with high brightness, and hardly cause exposure failure.

The image-forming optical element 12 includes lens element lines 14 defined by the lens elements 13 that have a similar structure to the SELFOC® lens element produced by Nippon Sheet Glass and that are arranged in two lines in a staggered manner along the rotating shaft 17 of the photosensitive drum 16.

Since the organic EL elements 9 formed in the line head 1 have the same structure as the organic EL device of the invention, the image-forming apparatus 100 can exhibit high brightness, and hardly cause exposure failure.

Organic EL Display Apparatus

Figure 13:
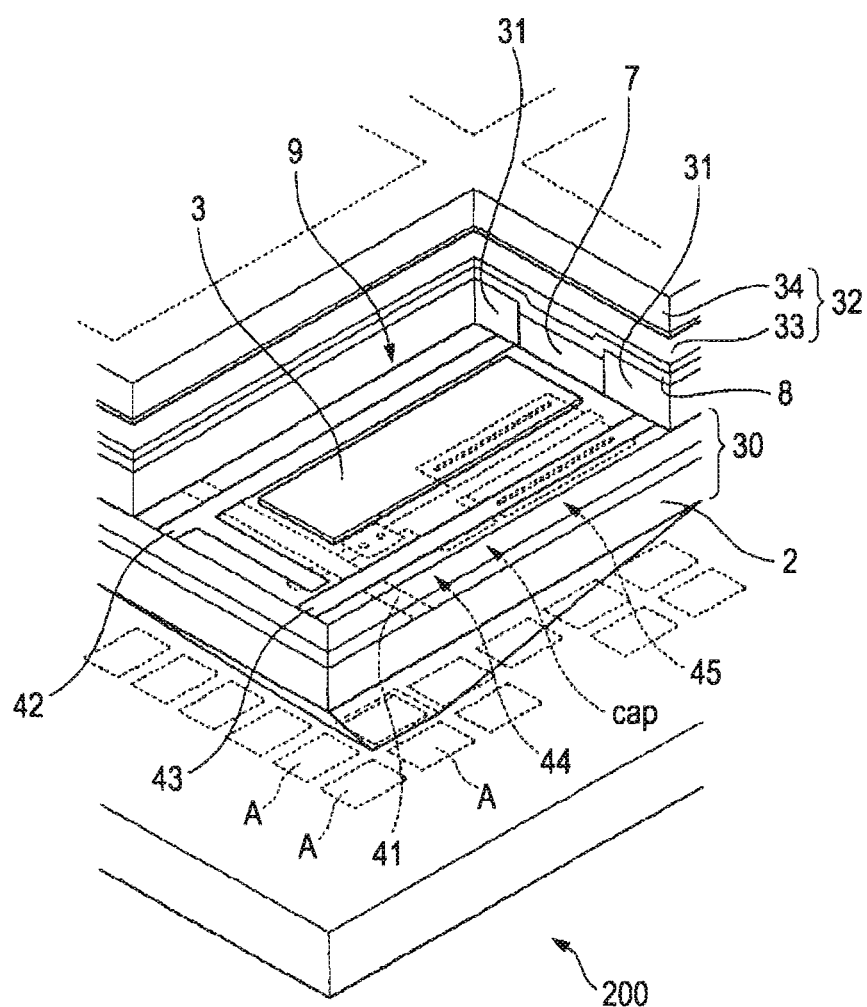
FIG. 13 is a schematic diagram of an organic EL display apparatus being an electronic apparatus of the Invention.

Another embodiment of the electronic apparatus including an organic EL device of the invention will now be described. FIG. 13 shows an organic EL display apparatus 200 being an embodiment of the electronic apparatus of the invention, and includes organic EL elements arranged in a matrix manner as pixels.

The organic EL display apparatus 200 includes a circuit element section 30 including thin-film transistors acting as circuit elements, pixel electrodes (first electrode) 3 being anodes, an organic function layer 7 including a luminescent layer, an opposing electrode (second electrode) 8 being the cathode, and a sealing portion 32 on a base 2.

A glass substrate may be used as the base 2. Other substrates used for electro-optic devices and circuits may also be used, such as substrates of silicon, quartz, ceramic, metals, plastic, and plastic films.

A plurality of pixel regions A are arranged in a matrix manner to define a light emitting region on the base 2. For displaying color images, pixel regions A according to, for example, red, green, and blue colors are arranged in a predetermined manner. Each pixel electrode 3 is disposed in the corresponding pixel region A. A signal line 2, a common power-supply line 43, a scanning line 41, and another scanning line for another pixel electrode are disposed in the vicinity of the pixel electrode 3. The pixel region A may be rectangular as show in FIG. 13, or circular, elliptical, or in any other shape when viewed from above.

The sealing portion 32 blocks water or oxygen to prevent the oxidation of the opposing electrode 8 and the organic function layer 7, and includes a sealing substrate (or sealing can) 34 bonded to the base 2. The sealing substrate 34 is made of glass or a metal, and is bonded to the base 2 with a sealing agent therebetween. A drying agent is disposed at the inner side of the base 2, and a layer 33 filled with an inert gas is formed in the space between the base and the sealing substrate 34.

Each pixel region A includes a first thin-film transistor 44 for switching having a gate electrode to which scanning signals are transmitted through a scanning line 41, a hold capacitor cap holding image signals from the signal line 42 through the thin-film transistor 44, a second thin-film transistor 45 for driving having a, gate electrode to which the image signals held in the hold capacitor cap are transmitted the pixel electrode 3 into which a driving current flows from the common power-supply line 43 when it is electrically connected to the common power-supply line 43 through the thin-film transistor 45, and an organic function layer 7 between the pixel electrode 3 and the opposing electrode 8. The organic function layer 7 includes a luminescent layer, and the organic EL element 9 being the light-emitting element includes the pixel electrode 3, the opposing electrode 8, and the organic function layer 7.

The organic EL elements 9 have any one of the structures shown in FIGS. 1, 4, 6, 8, and 10. Therefore they can emit light with high brightness, and accordingly the organic EL display apparatus can display bright images.

When the scanning line 41 is driven to turn on the first thin-film transistor 44, the potential of the signal line 42 at this time is held in the hold capacitor cap in the pixel region A, and the second thin-film transistor 45 is set depending on the state of the hold capacitor cap. Also, a current flows to the pixel electrode 3 from the common power-supply line 43 through the channel of the second thin-film transistor 45 and further flows to the opposing electrode 8 across the organic function layer 7. The organic function layer 7 emits light according to the current at this time.

While in the organic EL display apparatus 200, light emitted from the organic function layer 7 toward the base 2 is transmitted through the circuit element section 30 and the base Z and emitted downward through the base 2 (in the direction to the observer), light emitted from the organic function layer 7 in the opposite direction to the direction toward the base 2 is reflected from the opposing electrode 8 and transmitted through the circuit element section 30 and the base 2, thus being emitted downward through the base 2 (in the direction to the observer) (bottom emission type). If the opposing electrode 8 is made of a transparent material, light can be emitted through the opposing electrode (top emission type) In this instance, the transparent material for the opposing electrode may be ITO, Pt, Ir, Ni, or Pd.

In the organic EL display apparatus 200, the organic EL elements 9 formed in the pixel regions A have the same structure as that of the organic EL device of the invention. Therefore they can emit light with high brightness, and accordingly the display apparatus 200 can display bright images.

While the Invention has been described with reference to preferred embodiments and accompanying drawings, it is to be understood that the invention is not limited to the disclosed embodiments. The combinations and forms of components are no more than examples, and various modifications may be made without departing from the scope of the invention.

For example, the organic EL devices EL1 and EL2 of the first and second embodiments use the organic compound expressed by general formula (2) as the electron transport layer-forming material. However, the electron transport layer-forming material is not limited to the compound and may be the organic compound expressed by general formula (4), as long as the underlayer, or the luminescent layer, is insoluble in the solvent of the electron transport layer-forming material. The material and forming method of the electron transport layer can be arbitrarily selected as long as the luminescent layer is insoluble in the solvent of the electron transport layer-forming material.

The entire disclosure of Japanese Patent Application No. 2006-2196351 filed Aug. 11, 2006 is expressly incorporated by reference herein.

What is claimed is:

1. An organic electroluminescent device comprising:
   a light-emitting layer formed between a pair of electrodes by a wet process; and
   an electron transport layer,
      the light-emitting layer including:
         an organic material and a light-emitting material having a crosslinking property; and
         a first crosslinked layer formed by crosslinking the organic material having the crosslinking property, and arranged at least at an interface of the electron transport layer and the light-emitting layer, the electron transport layer including:
an electron transport layer-forming material that has a crosslinking property;
a second crosslinked layer formed by crosslinking the electron transport layer-forming material; and
an uncrosslinked layer in which the electron transport layer-forming material is not crosslinked,
the electron transport layer being formed on the light-emitting layer,
the second crosslinked layer being arranged at the interface of the electron transport layer and the light-emitting layer,
the uncrosslinked layer being arranged at an interface of the electron transport layer and one of the pair of electrodes,
the organic material being of a material expressed as

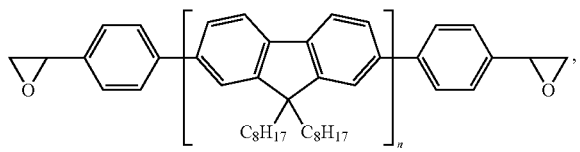

the light-emitting layer material being of a material expressed as

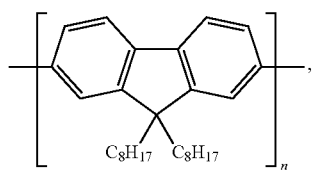

the electron transport layer-forming material comprising the following material

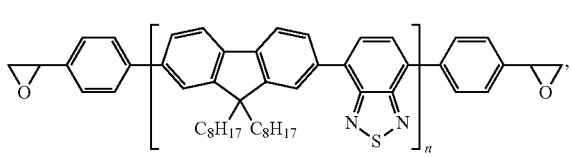

wherein n is an integer that is equal to, or greater than 1.

2. The organic electroluminescent device according to claim 1, an electrochemical oxidation potential of the light-emitting material forming the light-emitting layer being smaller than an electrochemical oxidation potential of the electron transport layer-forming material forming the electron transport layer.

3. The organic electroluminescent device according to claim 1,
the first crosslinked layer formed by crosslinking the light-emitting material.

4. The organic electroluminescent device according to claim 1, the light-emitting material being included within the first crosslinked layer.

5. An electronic apparatus comprising the organic electroluminescent device as set forth in claim 1.

6. A method for manufacturing an organic electroluminescent device including a light-emitting layer formed between a pair of electrodes by a wet process, and an electron transport layer, the method comprising:
forming the light-emitting layer including an organic material and a light-emitting material having a crosslinking property;
forming a first crosslinked layer by crosslinking, in the light-emitting layer, the organic material having the crosslinking property;
arranging the first crosslinked layer at least at an interface of the electron transport layer and the light-emitting layer;
forming the electron transport layer including an electron transport layer-forming material that has a crosslinking property;
forming a second crosslinked layer by crosslinking the electron transport layer-forming material; and
forming an uncrosslinked layer, arranged within the electron transport layer, in which the electron transport layer-forming material is not crosslinked,
the electron transport layer being formed on the light-emitting layer,
the second crosslinked layer being arranged at the interface of the electron transport layer and the light-emitting layer,
the uncrosslinked layer being arranged at an interface of the electron transport layer and one of the pair of electrodes,
the organic material being of a material expressed as

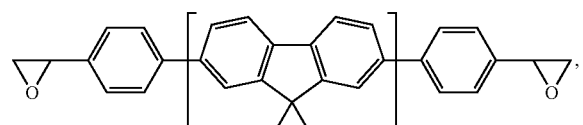

the light-emitting material being of a material expressed as

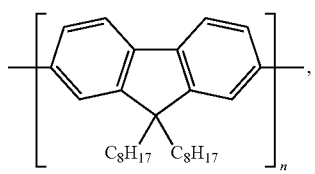

and the electron transport layer-forming material comprising the following material

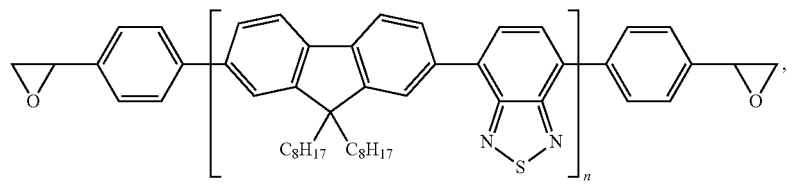

wherein n is an integer that is equal to, or greater than 1.

7. The method according to claim 6, an electrochemical oxidation potential of the light-emitting material forming the light-emitting layer being smaller than an electrochemical oxidation potential of the electron transport layer-forming material forming the electron transport layer.

8. The method according to claim 6, the first crosslinked layer being formed by crosslinking the light-emitting material.

9. The method according to claim 6, the light-emitting material being included within the first crosslinked layer.

10. The method according to claim 6, the organic material being a light-emitting material having a crosslinking property.

11. An electronic apparatus comprising the organic electroluminescent device manufactured by the method as set forth in claim 6.

* * * * *